(12) United States Patent
Choi et al.

(10) Patent No.: US 12,740,370 B2
(45) Date of Patent: Sep. 15, 2026

(54) POWER SUPPLY APPARATUS AND SEMICONDUCTOR MANUFACTURING EQUIPMENT, TRANSPORT SYSTEM INCLUDING THE SAME

(71) Applicant: SEMES CO., LTD., Cheonan-si (KR)

(72) Inventors: Chan Young Choi, Suwon-si (KR); Sang Oh Kim, Seoul (KR); Wan Hee Jeong, Hwaseong-si (KR); Hee Jae Byun, Hwaseong-si (KR)

(73) Assignee: SEMES CO., LTD., Cheonan-si (KR)

( * ) Notice: Subject to any disclaimer, the term of this patent is extended or adjusted under 35 U.S.C. 154(b) by 704 days.

(21) Appl. No.: 18/124,329

(22) Filed: Mar. 21, 2023

(65) Prior Publication Data

US 2024/0014059 A1 Jan. 11, 2024

(30) Foreign Application Priority Data

Jul. 5, 2022 (KR) ........................ 10-2022-0082714

(51) Int. Cl.

| | |
|---|---|
| ***H02J 50/12*** | (2016.01) |
| ***B25J 5/02*** | (2006.01) |
| ***B25J 11/00*** | (2006.01) |
| ***B25J 19/00*** | (2006.01) |
| ***H10P 72/30*** | (2026.01) |
| ***H10P 72/76*** | (2026.01) |

(52) U.S. Cl.

CPC ............ *H10P 72/3221* (2026.01); *B25J 5/02* (2013.01); *B25J 11/0095* (2013.01); *B25J 19/0045* (2013.01); *H02J 50/12* (2016.02); *H10P 72/7602* (2026.01)

(58) Field of Classification Search

CPC ..................... B25J 5/02; B25J 11/0095; H01L 21/67733; H01L 21/68707; H02J 50/12

See application file for complete search history.

(56) References Cited

U.S. PATENT DOCUMENTS 10,946,749 B2 3/2021 Hosek et al.

FOREIGN PATENT DOCUMENTS

| | | | |
|---|---|---|---|
| JP | 2009-240072 | 10/2009 | |
| JP | 2010-013009 | 1/2010 | |
| JP | 2010013009 A * | 1/2010 | ............. B60M 7/00 |
| KR | 10-0704052 | 4/2007 | |
| KR | 10-1559806 | 10/2015 | |
| KR | 10-2018-0004313 | 1/2018 | |
| KR | 10-2022-0020144 | 2/2022 | |

* cited by examiner

*Primary Examiner* — Robert J McCarry, Jr.

(57) ABSTRACT

Proposed is a power supply apparatus capable of suppressing heat generation, and semiconductor manufacturing equipment and a transport system including the same. The power supply apparatus, which supplies power to a transport device in semiconductor manufacturing equipment, includes a first base member made of a conductive material installed along a moving path of the transport device, a second base member provided on a surface of the first base member and made of a magnetic core material, a track member provided as an installation structure disposed on a side of the second base member, a power supply member installed in the track member and to which current is applied to supply power, and a power reception member disposed in a power reception core member provided in the transport device at a predetermined interval from the power supply member, and magnetically coupled to the power supply member to generate an induced current.

20 Claims, 17 Drawing Sheets

POWER SUPPLY APPARATUS AND SEMICONDUCTOR MANUFACTURING EQUIPMENT, TRANSPORT SYSTEM INCLUDING THE SAME

CROSS-REFERENCE TO RELATED APPLICATION

This Patent Application claims priority to Korean Patent Application No. 10-2022-0082714, filed on Jul. 5, 2022, the entire contents of which are incorporated by reference herein for all purposes.

BACKGROUND

Field of the Invention

The present disclosure relates to a power supply apparatus that supplies power to a transport device, and semiconductor manufacturing equipment and a transport system including the same.

Description of the Related Art

The semiconductor manufacturing process is a process of manufacturing semiconductor products capable of processing electrical signals. Semiconductor manufacturing is broadly divided into the "pre-process (front-end)" and "post-process (back-end)". The pre-process involves forming a pattern on a wafer (substrate) through processing steps such as oxidation, exposure, etching, ion implantation, and deposition. The back-end process refers to a packaging process for manufacturing a semiconductor package in the form of a finished product through steps such as wafer dicing, die bonding, wiring, molding, marking, and testing of patterned wafers. In order to perform each manufacturing process, semiconductor manufacturing equipment for performing individual processes is provided in cleanrooms of a semiconductor manufacturing plant so that a process treatment is performed on a substrate put into the semiconductor manufacturing equipment.

In a transport system for transporting articles in a semiconductor manufacturing facility or in a semiconductor manufacturing plant, various transport devices for transporting articles (e.g., wafers, carriers, etc.) are applied. A transport device is configured to move by generating power using an electrical signal as in the case of a motor. For a wafer transfer robot that transfers wafers in a semiconductor manufacturing facility, a method of supplying power through a wired cable is mainly used. Yet, as the level of cleanliness required inside the facility increases, the application of non-contact power supply technology is being discussed.

In this context, a wireless power transmission technology using a magnetic field may be introduced for non-contact power supply. There are two main methods for a wireless power transmission depending on the shape of the magnetic field: magnetic induction and magnetic resonance. Magnetic induction is a method whereby an induced current is generated in the secondary coil by a magnetic field created by the current flowing in the primary coil, and magnetic resonance is a method whereby a magnetic field is created in the secondary coil having the same resonant frequency as the primary coil when a magnetic field is created due to a signal of a resonant frequency in the primary coil to generate an induced current.

Although the magnetic induction method is generally widely used, it is also necessary to apply the magnetic resonance method, characterized by high driving frequency and the installation of compensation capacitor circuit, in order to supply more power as greater power is required with the increase in the required speed of a transport device in a semiconductor manufacturing facility. However, in the case of the magnetic resonance method with high power density, it is difficult to apply the method to temperature-sensitive semiconductor manufacturing facilities due to a high level of heat generation.

SUMMARY

Accordingly, the present disclosure has been made keeping in mind the above problems occurring in the related art, and the present disclosure is intended to provide a power supply apparatus capable of suppressing heat generation, and semiconductor manufacturing equipment and a transport system including the same.

In order to achieve the above objective, according to an embodiment of the present disclosure, there is provided a power supply apparatus that supplies power to a transport device in semiconductor manufacturing equipment. The power supply apparatus may include a first base member made of a conductive material installed along a moving path of the transport device, a second base member provided on a surface of the first base member and made of a magnetic core material, a track member provided as an installation structure disposed on a side of the second base member, a power supply member installed in the track member and to which current is applied to supply power, and a power reception member disposed in a power reception core member provided in the transport device at a predetermined interval from the power supply member, and magnetically coupled to the power supply member to generate an induced current.

According to an embodiment of the present disclosure, the second base member may be provided on top of the first base member.

According to an embodiment of the present disclosure, the second base member may be configured to be inserted into a groove formed in the first base member.

According to an embodiment of the present disclosure, the first base member may be made of aluminum (Al) material.

According to an embodiment of the present disclosure, the second base member may be composed of one of a ferrite core, powdered Permalloy, or mu-metal.

According to an embodiment of the present disclosure, the power reception core member may be a ferrite core having an "E" shape and composed of a plurality of protrusions, the power supply member may be located in a space between the protrusions of the power reception core member, and the power reception member may be provided on each side of a central protrusion among the plurality of protrusions of the power reception core member.

According to an embodiment of the present disclosure, the power reception core member may be a ferrite core having a "T" shape in which a protrusion is formed in the center, the power supply member may be each located to be spaced apart from each side of the protrusion by a predetermined distance, and the power reception member may be provided on each side of the protrusion of the power reception core member.

A semiconductor manufacturing equipment according to the present disclosure may include a processing module in which processes on substrates are performed, a substrate transfer robot configured to transfer the substrates, and a power supply apparatus configured to supply power to the substrate transfer robot. The power supply apparatus may include a first base member made of a conductive material installed along a moving path of the substrate transfer robot, a second base member provided on a surface of the first base member and made of a magnetic core material, a track member provided as an installation structure disposed on the second base member, a power supply member installed on a side of the track member and to which current is applied to supply power, and a power reception member disposed in a power reception core member provided in the substrate transfer robot at a predetermined interval from the power supply member, and magnetically coupled to the power supply member to generate an induced current.

A transport system for transporting articles in a semiconductor manufacturing plant according to the present disclosure may include a travel rail configured to provide a travel path of a transport cart for transporting the articles, and a power supply apparatus configured to supply power to the transport cart. The power supply apparatus may include a first base member made of a conductive material installed along a moving path of the transport cart, a second base member provided on a surface of the first base member and made of a magnetic core material; a track member provided as an installation structure disposed on a side of the second base member, a power supply member installed in the track member and to which current is applied to supply power, and a power reception member disposed in a power reception core member provided in the transport cart at a predetermined interval from the power supply member, and magnetically coupled to the power supply member to generate an induced current.

As described above, according to the present disclosure, by configuring a second base member of magnetic core material on the surface of a first base member of conductive material, it is possible to suppress stray load loss occurring in a base plate and consequent heat generation.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION

Figure 1:
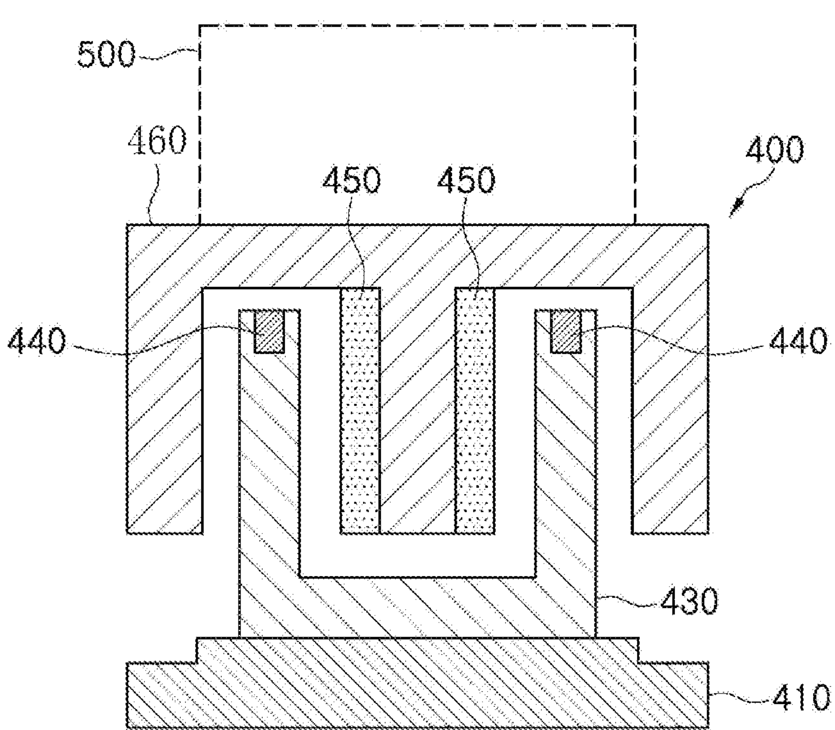
FIG. 1 illustrates a conventional power supply apparatus.

Hereinafter, with reference to the accompanying drawings, embodiments of the present disclosure will be described in detail so that those skilled in the art may easily carry out the present disclosure. The present disclosure may be embodied in many different forms and is not limited to the embodiments set forth herein.

In order to clearly describe the present disclosure, parts irrelevant to the description are omitted, and the same reference numerals are assigned to the same or similar components throughout the specification.

In addition, in various embodiments, components having the same configuration will be described only in representative embodiments by using the same reference numerals, and in other embodiments, only configurations different from the representative embodiments will be described.

Throughout the specification, when a part is said to be "connected (or coupled)" to another part, this includes not only the case of being "directly connected (or coupled)" but also "indirectly connected (or coupled)" with another member in between. In addition, when a part "includes", "has", or "comprises" a certain part, this means that other components may be further included without excluding other components unless otherwise stated.

Unless otherwise defined, all terms used herein, including technical or scientific terms, have the same meaning as commonly understood by a person skilled in the art. Terms such as those defined in the commonly used dictionaries should be construed as having meanings consistent with the meanings in the context of the related art and shall not be construed in ideal or excessively formal meanings unless expressly defined in this application.

FIG. 1 illustrates a conventional power supply apparatus 400. The power supply apparatus 400 is configured to supply power to a transport device 500. The power supply apparatus 400 includes a first base member 410, a track member 430 provided on top of the first base member 410, a power supply member 440 provided in the track member 430, and a power reception member 450 provided on a power reception core member 460 coupled to the transport device 500.

The first base member 410 is made of a metallic material (conductor) such as aluminum (Al). The first base member 410 may be disposed along a transport path of the transport device 500. On top of the first base member 410, the track member 430 is similarly disposed along the transport path of the transport device 500. The track member 430 may have a shape corresponding to the shape of the power reception core member 460. For example, as shown in FIG. 1, the track member 430 may be configured in a shape of an optimal topology such as a square with one side open to match the shape of the power reception core member 460 formed in an "E" shape. The power reception member 450 is installed at a position adjacent to the power supply member 440 in the power reception core member 460, and an induced current is generated in the power reception member 450 by a magnetic field induced from the power supply member 440, supplying power to the transport device 500.

Figure 2:
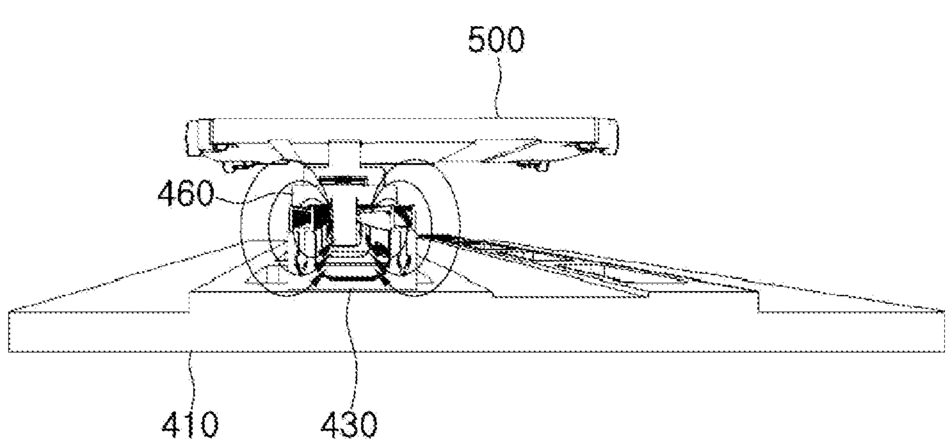
FIG. 2 is a view illustrating a process in which heat is generated by a power supply apparatus.

However, in the case of the conventional power supply apparatus 400 as shown in FIG. 1, eddy currents may be generated in conductive objects including the first base member 410 or surrounding electric devices by a leakage magnetic field induced in the track member 430, which causes heat generation. In a semiconductor manufacturing line, such heat generation may have an effect on the temperature of a wafer, and thus it is necessary to prevent heat generation caused by the power supply apparatus 400 in order to prevent the heat generation from affecting an overall process. As shown in FIG. 2, a magnetic field (B-field) created by the power supply apparatus 400 generates eddy currents on the upper surface of the first base member 410, and heat may be generated due to the eddy currents. When a high-frequency signal (1 MHz or higher) is used to increase power transmission efficiency and transmit/receive power density, heat generation may further increase.

Accordingly, in a power supply apparatus 400 of the present disclosure, a second base member 420 made of a magnetic core material is formed on the surface of a first base member 410 to prevent eddy current from occurring due to a leakage magnetic field, thereby suppressing heat generation. A magnetic core material refers to a magnetic material having high permeability and capable of inducing a magnetic field. In this document, a ferrite core is representatively described as an example of the magnetic core material. The second base member 420 may be made of a material such as ferrite core, powdery Permalloy, or mu-metal, but the material of the second base member 420 is not limited to a specific material. Ferrite refers to a ceramic-like material with magnetic properties containing iron oxide, and nickel-zinc (Ni—Zn) ferrite or manganese-zinc (Mn—Zn) ferrite may be used. Permalloy is a nickel-iron (Ni—Fe) alloy with high magnetic permeability. Mu-metal is a nickel-zinc (Ni—Zn) soft ferromagnetic alloy.

Figure 3:
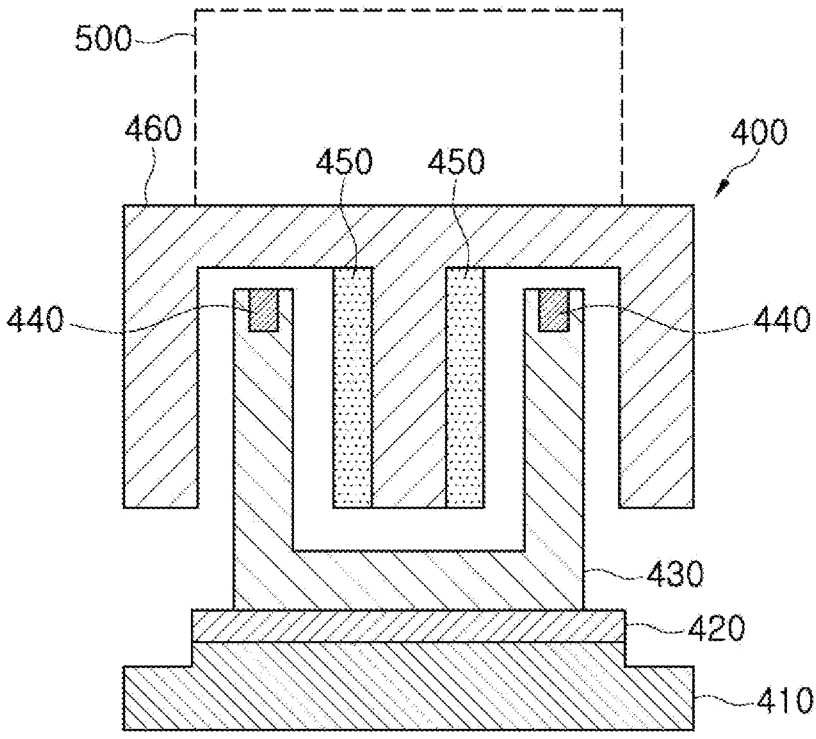
FIGS. 3 and 4 illustrate a power supply apparatus according to an embodiment of the present disclosure.
Figure 4:
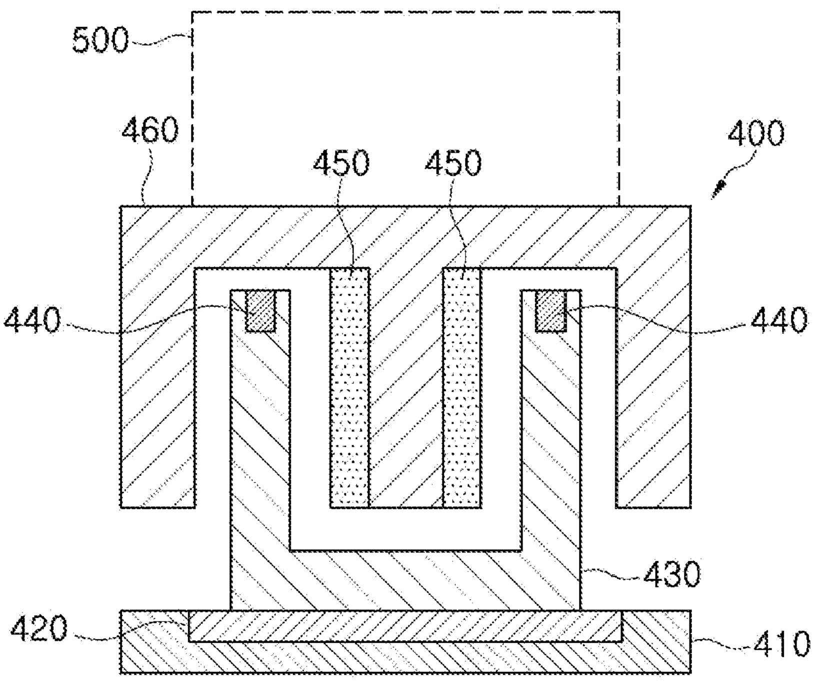

FIGS. 3 and 4 illustrate the power supply apparatus 400 according to the present disclosure. The power supply apparatus 400 for supplying power to a transport device 500 according to the present disclosure includes a first base member 410 made of a conductive material installed along a moving path of the transport device 500, a second base member 420 provided on the surface of the first base member 410 and made of a magnetic core material, a track member 430 provided as an installation structure disposed on one side of the second base member 420, a power supply member 440 installed in the track member 430 and to which current is applied to supply power, and a power reception member 450 disposed in a power reception core member 460 provided in the transport device 500 at a predetermined interval from the power supply member 440, and magnetically coupled to the power supply member 440 to generate an induced current.

According to the present disclosure, since the first base member 410 is provided with the second base member 420 made of a magnetic core material, generation of eddy current on the surface of the first base member 410 due to a leakage magnetic field may be prevented and heat generation may be prevented.

According to an embodiment of the present disclosure, the leakage magnetic field of the current of the power supply member 440 is suppressed or the second base member 420 is inserted into a portion in contact with the first base member 410 positioned below the track member 430. According to the present disclosure, the amount of magnetic flux linking the first base member 410 made of a conductive material made of a metal such as aluminum may be reduced, and thus the strength of eddy currents may be reduced.

According to the embodiment of the present disclosure, the second base member 420 may be formed on top of the first base member 410. For example, the second base member 420 may be formed on top of the first base member 410 as shown in FIG. 3. The second base member 420 may be attached to an upper portion of the first base member 410. The second base member 420 may be made of a magnetic material in powder form and coated on top of the first base member 410.

According to the embodiment of the present disclosure, the second base member 420 may be inserted into a groove formed in the first base member 410. For example, the second base member 420 may be inserted into a groove formed in the first base member 410 as shown in FIG. 4. After the first base member 410 made of a metallic material such as aluminum is molded, a groove is formed in the first base member 410, and the second base member made of a ferrite core material may be inserted into the groove formed in the first base member 410.

After configuring the second base member 420 on the first base member 410, the track member 430 may be installed as an installation structure on top of the second base member 420. The track member 430 may be made of a ferrite core material, and although not specifically shown, a clip-type structure made of polycarbonate (PC) material is installed at the end of the track member 430, and the power supply member 440 may be fitted into the clip-type structure.

In this document, a ferrite core member is described as an example for a material of the second base member 420 to prevent eddy currents due to a leakage magnetic field, but other materials having magnetic properties may also be applied. In addition, although in this document, for convenience of explanation, a case in which the second base member 420 is provided on top of the first base member 410 and the track member 430 is provided on top of the second base member 420 is described as an example, the direction in which each component is installed is not limited to a specific direction, and may be various directions such as vertical direction (up-down direction), horizontal direction (left-right direction), and diagonal direction depending on the system configuration.

According to the embodiment of the present disclosure, the first base member 410 may be made of a metallic material. For example, the first base member 410 may be made of a material such as aluminum (Al) or copper (Cu).

According to the embodiment of the present disclosure, as shown in FIGS. 3 and 4, the power reception core member 460 may have an "E" shape composed of a plurality of protrusions. As shown in FIGS. 3 and 4, the power supply member 440 may be located in the space between the protrusions of the power reception core member 460, and the power reception member 450 may be provided on a side surface of a central protrusion of the power reception core member 460.

According to an embodiment of the present disclosure, the shape of the power supply apparatus 400 is not limited to a specific shape and may be implemented in various shapes through optimal phase design. For example, the power reception core member 460 may have an "S" shape or a "T" shape.

Figure 12:
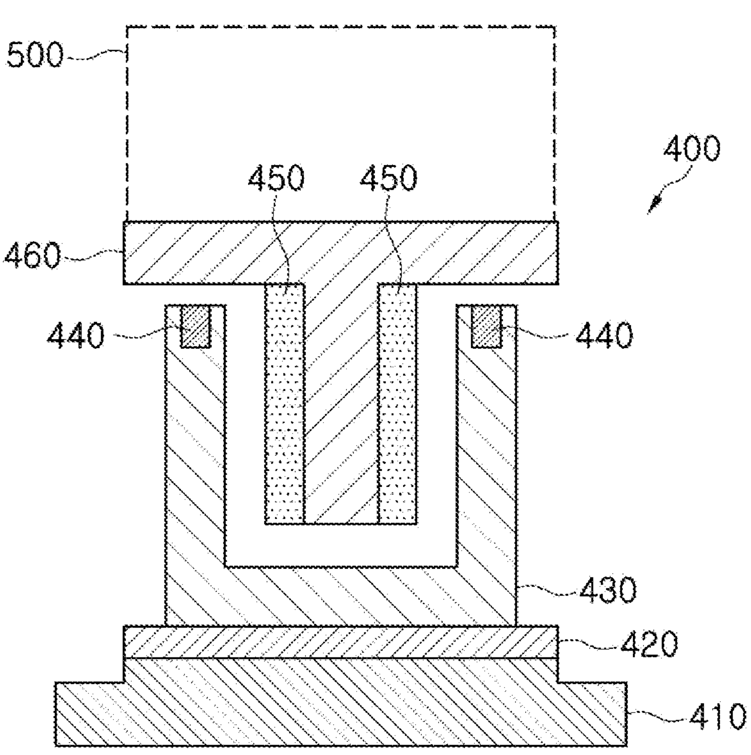
FIGS. 12 and 13 illustrate a power supply apparatus according to another embodiment of the present disclosure.

For example, as shown in FIG. 12, the power reception core member 460 may be a ferrite core having a "T" shape with a protrusion formed in the center, the power supply member 440 may be spaced apart from both sides of a protrusion by a predetermined distance, and the power reception member 450 may be provided on both sides of the protrusion of the power reception core member 460.

Figure 13:
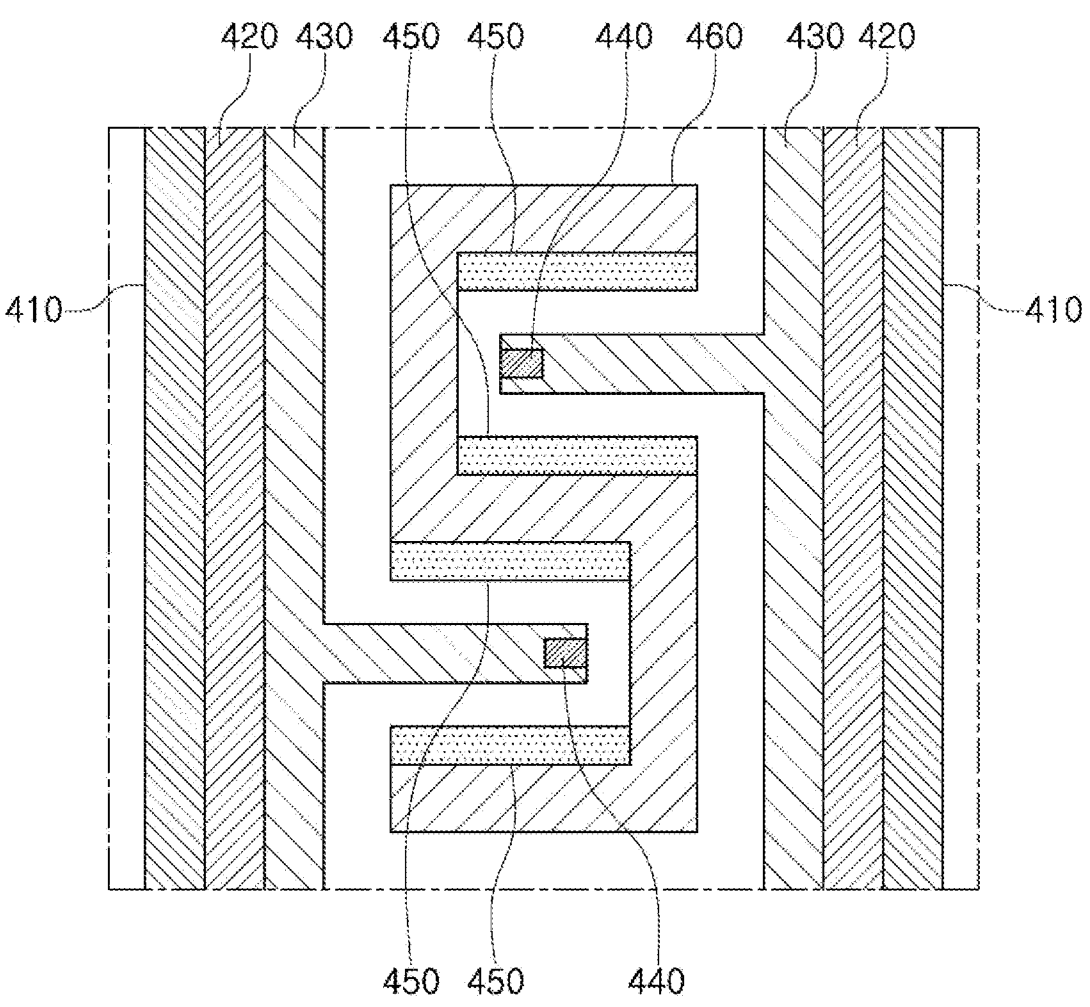

Alternatively, as shown in FIG. 13, the power reception core member 460 may be a ferrite core having an "S" shape having a first space and a second space opened in opposite directions to each other, the power supply member 440 may be located in each of the first space and the second space, and the power reception member 450 may be provided in the power reception core member 460 so as to be spaced apart from the power supply member 440 located in the first space and the second space by a predetermined distance.

The power supply apparatus 400 according to the present disclosure may be used to power a transport device (wafer transfer robot) that transfers substrates such as wafers inside a semiconductor manufacturing facility.

Figure 5:
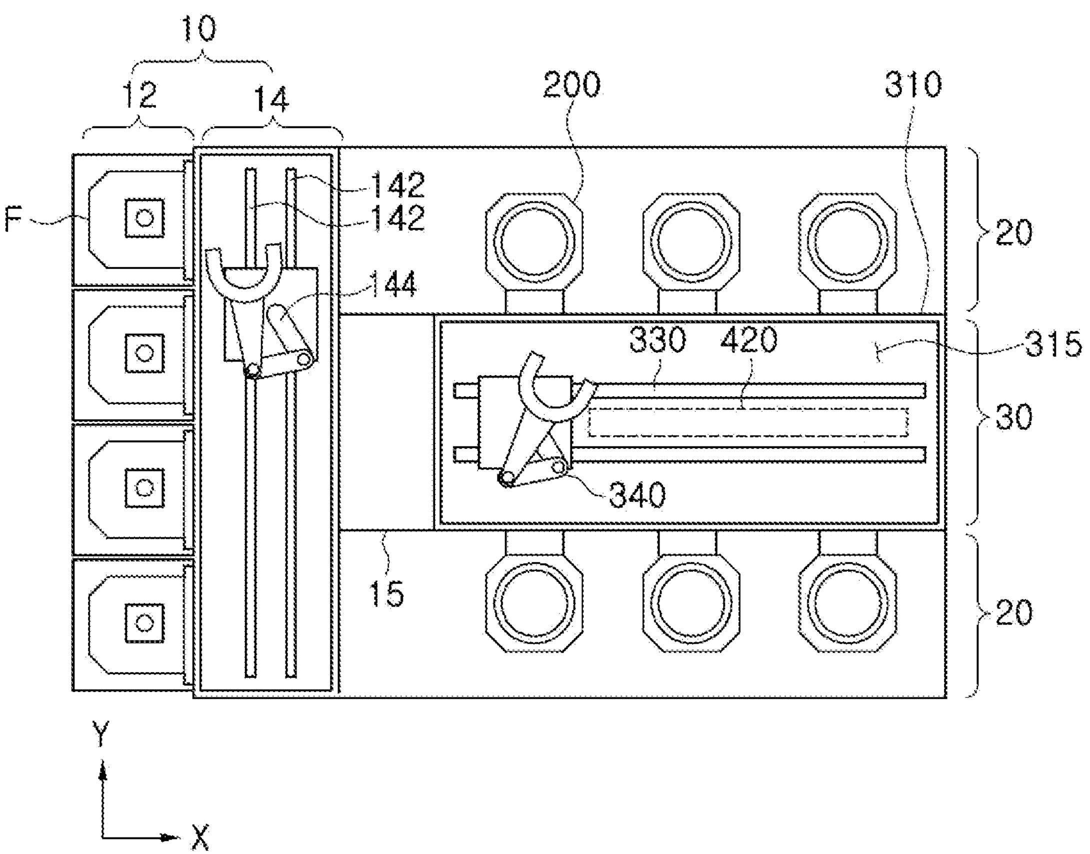
FIGS. 5 and 6 illustrate semiconductor manufacturing equipment to which the power supply apparatus according to the present disclosure is applied.
Figure 6:
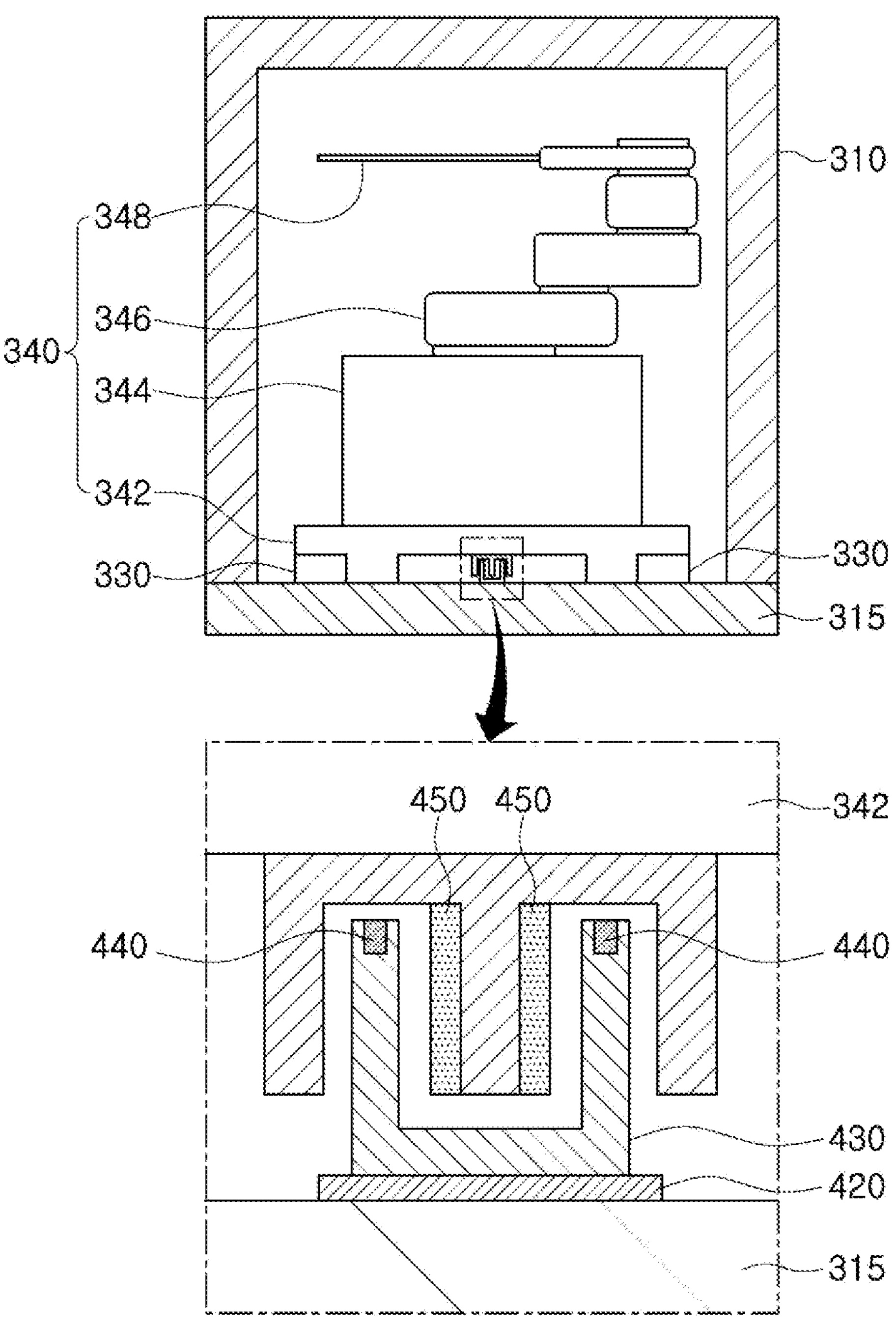

FIGS. 5 and 6 illustrate semiconductor manufacturing equipment to which the power supply apparatus according to the present disclosure is applied. FIG. 5 illustrates a schematic layout of semiconductor manufacturing equipment to which the power supply apparatus 400 according to the present disclosure is applied, and FIG. 6 illustrates a substrate transfer robot 340 powered by the power supply apparatus 400 according to the present disclosure.

Semiconductor manufacturing equipment to which the present disclosure may be applied is a device for performing semiconductor processing steps such as etching, cleaning, coating, developing, and deposition. The application of the present disclosure is not limited to equipment for a specific process and may be applied to any type of equipment.

The semiconductor manufacturing equipment according to an embodiment of the present disclosure includes a loading unit 10 for accommodating a cassette F in which a substrate is accommodated, and withdrawing a substrate from the cassette F or receiving a substrate into the cassette F, a processing module 20 in which a process on a substrate is performed, and a substrate transfer module 30 for transferring substrates between the loading unit 10 and the processing module 20.

The loading unit 10 includes a load port 12 in which a cassette F in which a substrate is accommodated is seated, and an index part 14 for taking out a substrate from a cassette F seated in the load port 12 or carries a substrate that has been processed into a cassette F. A plurality of the load ports 12 may be disposed on the side of the semiconductor manufacturing equipment along a specific direction (e.g., the Y-axis direction), may open the door of a cassette F after the cassette F transported by an overhead hoist transport (OHT) is seated in the load port 12. The index part 14 may be disposed adjacent to the load port 12. The index part 14 may include an index guide member 142 disposed along the arrangement direction (Y direction) of the load ports 12, and an index robot 144 that moves along the index guide member 142 and transfers a substrate. The index robot 144 may receive a substrate from a cassette F and transfers the substrate to a load lock chamber 15 where substrates are temporarily stored, or receive a substrate temporarily stored in the load lock chamber 15 and transfer the substrate to the inside of a cassette F.

The processing module 20 is a device in which processing of a substrate is performed, and may include one or more processing chambers 200. A plurality of processing chambers 200 may be arranged along a specific direction (e.g., X direction). Individual processing chambers 200 may perform the same process or may perform different processes. For example, some processing chambers 200 may perform an etching process on a substrate, and some other processing chambers 200 may perform a cleaning process on the etched substrate.

The substrate transfer module 30 is disposed adjacent to the processing module 20, and may receive a substrate from the load lock chamber 15 and transfer the substrate to the processing module 20 or transfer a substrate processed in the processing module 20 to the load lock chamber 15. The substrate transfer module 30 may include a guide member 330 disposed along the direction (X direction) in which the processing chambers 200 are disposed, and a substrate transfer robot 340 that transfers a substrate while moving along the guide member 330. A base plate 315 as a first base member 410 made of a conductor such as aluminum (Al) may be positioned on the bottom surface of the substrate transfer module 30, and a second base member 420 made of a magnetic core material may be installed on the base plate 315 to prevent eddy current loss. The second base member 420 may be installed over the entire moving section of the substrate transfer robot 340 in the first base member 410 or may be partially installed.

The substrate transfer robot 340 transfers substrates while moving inside a transport chamber 310. The substrate transfer robot 340 includes a linear drive portion 342 that moves along the guide member, a robot arm portion 346 composed of arm members that handle substrates by being rotationally driven around a plurality of axes, an arm drive portion 344 that controls the operation of the robot arm portion 346, and a robot hand portion 348 coupled to the robot arm portion 346 and supporting a substrate from the bottom.

According to the present disclosure, the substrate transfer robot 340 of the semiconductor manufacturing equipment may be powered by the power supply apparatus 400 described above. The semiconductor manufacturing equipment according to the present disclosure includes a processing module 20 for processing a substrate, a substrate transfer robot 340 for transferring a substrate, and a power supply apparatus 400 for supplying power to the substrate transfer robot 340. The power supply apparatus 400 includes a first base member 410 made of a conductive material and installed along the moving path of the substrate transfer robot 340, a second base member 420 made of magnetic cores provided on the first base member 410, a track member 430 provided as a structure disposed on the second base member 420, a power supply member 440 installed on the track member 430 and to which current for supplying power is applied, and a power reception member 450 disposed on a power reception core member 460 provided in the substrate transfer robot 340 at a predetermined interval from the power supply member 440, and magnetically coupled to the power supply member 440 to generate an induced current.

According to an embodiment of the present disclosure, the second base member 420 may be formed on top of the first base member 410.

According to the embodiment of the present disclosure, the second base member 420 may be inserted into a groove formed in the first base member 410.

According to the embodiment of the present disclosure, the first base member 410 may be made of a metallic material.

According to an embodiment of the present disclosure, the power reception core member 460 may have an "E" shape composed of a plurality of protrusions. The power supply member 440 may be located in the space between the protrusions of the power reception core member 460, and the power reception member 450 may be provided on a side surface of the central protrusion of the power reception core member 460.

Meanwhile, the power supply apparatus 400 according to the present disclosure may be configured to supply power to a transport system such as an overhead hoist transport (OHT) or a lifter that transports products in a manufacturing plant.

Figure 7:
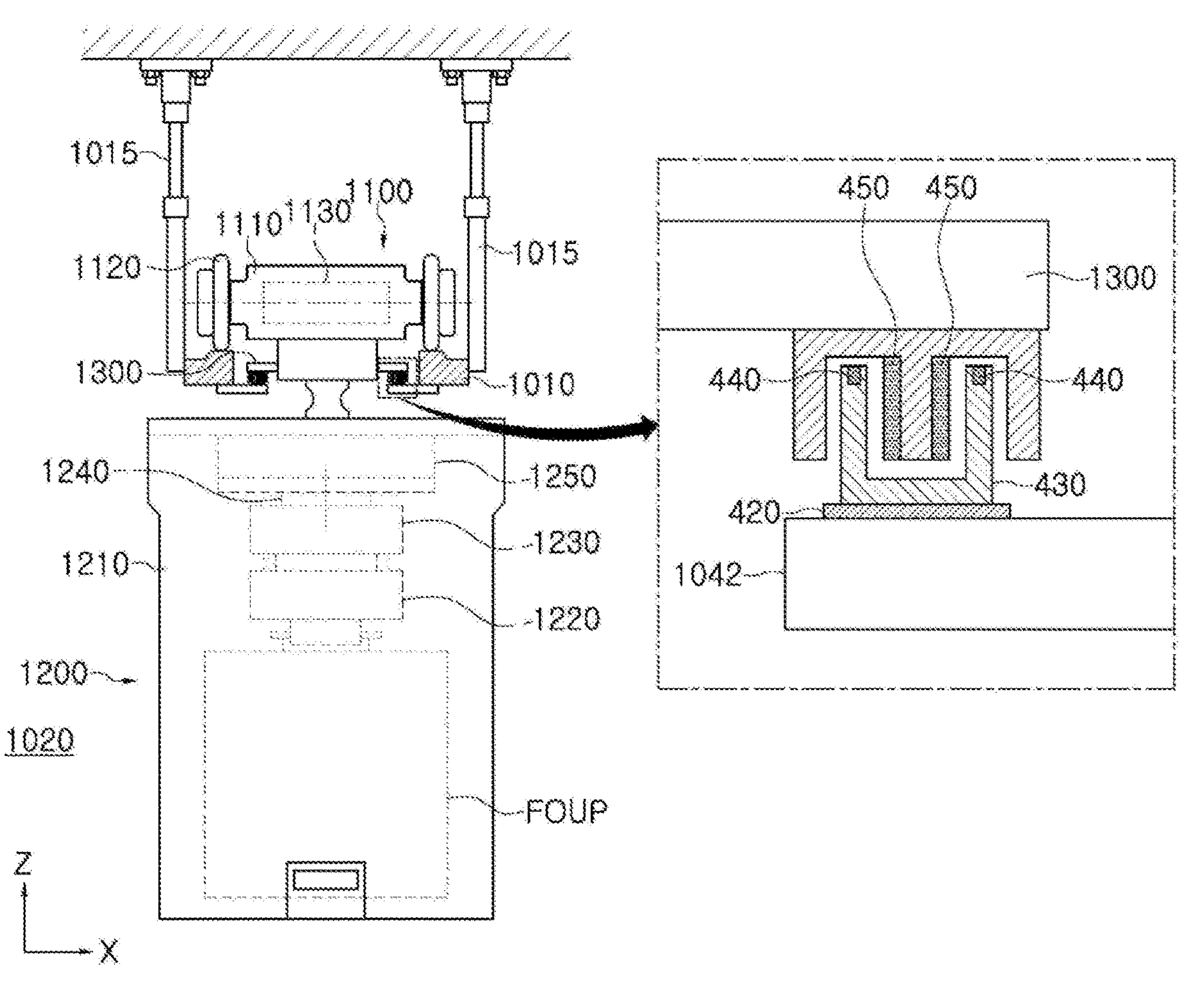
FIG. 7 illustrates a transport system in a semiconductor manufacturing plant to which the power supply apparatus according to the present disclosure is applied.
Figure 8:
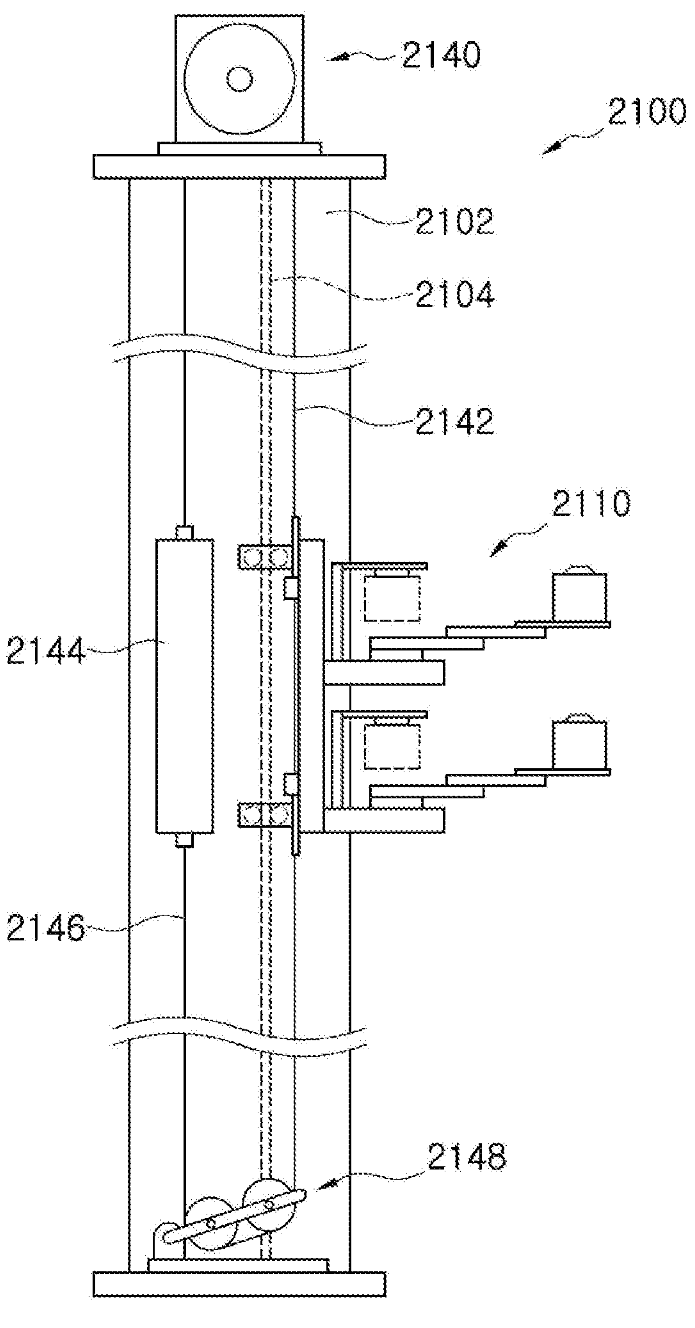
FIGS. 8 to 11 illustrate a tower lift of a semiconductor manufacturing plant to which the power supply apparatus according to the present disclosure is applied.
Figure 9:
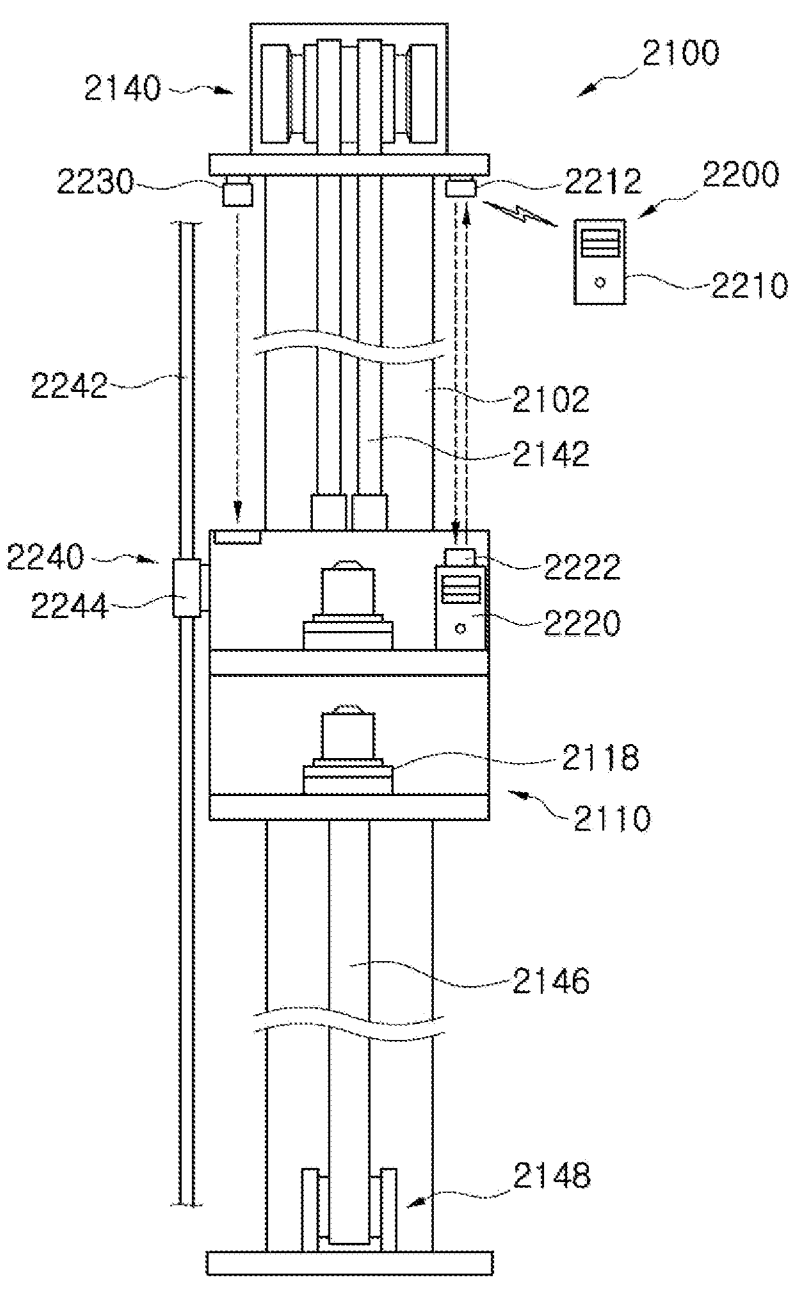

FIG. 7 illustrates a transport system in a semiconductor manufacturing plant to which the power supply apparatus according to the present disclosure is applied. In the semiconductor manufacturing plant, pieces of semiconductor manufacturing equipment as shown in FIG. 5 are arranged, and a transport system for transporting articles to each semiconductor manufacturing equipment is provided. The transport system may include a travel rail 1010 installed on the ceiling, and a transport cart 1020 that travels along the travel rail 1010 and transports articles. FIG. 7 is a view from the front of the transport cart 1020 traveling along the travel rail 1010.

Referring to FIG. 7, the travel rail 1010 includes a pair of rail members spaced apart from each other in the horizontal direction and paired with each other, and is installed on the ceiling side of the semiconductor manufacturing plant by rail supports 1015. Each of the rail supports 1015 may have a lower portion supporting the pair of rail members and an upper portion fixed to the ceiling of the semiconductor manufacturing plant. The pair of rail members may be formed to provide a running surface on the upper sides thereof.

Referring to FIG. 7, the transport cart 1020 includes a travel part 1100 traveling along the travel rail 1010, and a hoist part 1200 supporting an article under the travel part 1100. The hoist part 1200 moves together with the travel part 1100 and transfers and loads articles to manufacturing equipment 1030.

The travel part 1100 includes a body 1110 and drive wheels 1120. An axle extending in the left-right direction is mounted on the body 1110. A plurality of axles may be provided and may be spaced apart from each other in the front-rear direction. The drive wheels 1120 serve to impart mobility to the body 1110 so that the body 1110 may travel according to the guidance of the travel rail 1010. The drive wheel 1120 may be mounted on each end of the axle. The drive wheels 1120 rotate in contact with the upper surfaces of a pair of the travel rails 1010, respectively. The travel part 1100 further includes a wheel drive unit 1130 that provides power for rotating the drive wheels 1120. As an example, the wheel drive unit 1130 may be configured to rotate an axle.

The hoist part 1200 includes a hoist housing 1210. The hoist housing 1210 is connected to the travel part 1100 below the travel rails 1010. The upper part of the hoist housing 1210 may be connected to the lower part of the body 1110 by one or more connectors. The hoist housing 1210 provides an accommodation space in which articles are accommodated. The hoist housing 1210 has a structure in which left and right sides and a lower side thereof are open so that articles may be moved in a horizontal direction (X direction) in the accommodation space and moved in a downward direction.

In addition, the hoist part 1200 further includes hand unit 1220 for gripping or releasing an article, and a hand moving unit for moving the hand unit 1220 between a first position and a second position. The first position is a position where an article gripped by the hand unit 1220 is accommodated in the accommodation space of the hoist housing 1210, and the second position is the outside of the hoist housing 1210 corresponding to a position out of the first position. The hand moving unit includes a vertical drive unit 1230, rotation drive unit 1240, and horizontal drive unit 1250.

The hand unit 1220 may include a hand that grips and releases an article, and a hand support that supports the hand. The vertical drive unit 1230 moves the hand unit 1220 in the vertical direction. The vertical drive unit 1230 may move the hand unit 1220 in the vertical direction (Z direction) by winding or unwinding at least one belt with respect to a drum. The rotation drive unit 1240 rotates the hand unit 1220 about an axis in the vertical direction, while the horizontal drive unit 1250 moves the hand unit 1220 left and right. For example, by moving the hand unit 1220 in the vertical direction by means of the vertical drive unit 1230, rotating the vertical drive unit 1230 about the axis in the vertical direction by means of the rotation drive unit 1240, and moving the rotation drive unit 1240 in the left-right direction by means of the horizontal drive unit 1250, an article gripped by the hand unit 1220 may be moved in the vertical direction, rotated about the axis in the vertical direction, or moved in the left-right direction.

The power supply apparatus 400 according to the present disclosure may be configured to supply power to the transport cart 1020. For example, as shown in FIG. 7, the power supply apparatus 400 may be configured between a power supply structure 1042 formed under the travel rails 1010 and a power reception structure 1300 formed at the lower portion of the travel part 1100.

A transport system for transporting articles in a semiconductor manufacturing plant according to the present disclosure includes a transport cart 1020 for transporting articles, a travel rail 1010 providing a travel path for the transport cart 1020, and a power supply apparatus 400 for supplying power to the transport cart 1020.

A semiconductor manufacturing equipment according to the present disclosure includes a processing module 20 for processing a substrate, a substrate transfer robot 340 for transferring a substrate, and a power supply apparatus 400 for supplying power to the substrate transfer robot 340.

The power supply apparatus 400 includes a first base member 410 installed along a moving path of the transport cart 1020, a second base member 420 provided on the first base member 410, a track member 430 disposed on the second base member 420, a power supply member 440 installed in the track member 430, and a power reception member 450 disposed in a power reception core member 460 provided in the transport device 500 at a predetermined interval from the power supply member 440, and magnetically coupled to the power supply member 440 to generate an induced current.

According to an embodiment of the present disclosure, the second base member 420 may be provided on top of the first base member 410.

According to the embodiment of the present disclosure, the second base member 420 may be inserted into a groove formed in the first base member 410.

According to the embodiment of the present disclosure, the first base member 410 may be made of a metallic material.

According to an embodiment of the present disclosure, the power reception core member 460 may have an "E" shape composed of a plurality of protrusions. The power supply member 440 may be located in the space between the protrusions of the power reception core member 460, and the power reception member 450 may be provided on a side surface of the central protrusion of the power reception core member 460.

FIGS. 8 to 11 illustrate a tower lift 2100 of a semiconductor manufacturing plant to which the power supply apparatus 400 according to the present disclosure is applied. The tower lift 2100 may be used to transport articles in the vertical direction in a multi-story building. For example, the tower lift 2100 may be used to transport articles between floors in a multi-story manufacturing plant where pieces of semiconductor or display manufacturing equipment are arranged.

The tower lift 2100 may include a main frame 2102 vertically extending between at least two floors in a semiconductor manufacturing plant, a carriage module 2110 configured to be vertically movable along the main frame 2102, a drive module 2140 for vertically moving the carriage module 2110, and a non-contact power supply part 2240 for supplying power to the carriage module 2110 in a non-contact manner. The power supply apparatus according to the present disclosure may be applied to the power supply part 2240 of the tower lift 2100.

The power supply part 2240 may include a power supply cable 2242 configured to extend along the main frame 2102 to pass through all floors on which the carriage module 2110 travels, and at least one pickup unit 2244 mounted on the carriage module 2110, and configured to receive electric power from the power supply cable 2242 through magnetic induction and supply power to the carriage module 2110. In addition, the tower lift 2100 may include a power supply module 2250 disposed on one of the floors on which the carriage module 2110 travels and configured to supply power to the power supply cable 2242.

The tower lift 2100 may include a control module 2200 for controlling the operation of the carriage module 2110. In particular, according to an embodiment of the present disclosure, the control module 2200 may include a main controller 2210 providing control signals for controlling the carriage module 2110, and a carriage controller 2220 mounted on the carriage module 2110 and controlling the operation of the carriage module 2110 according to a control signal. Signal transmission between the main controller 2210 and the carriage controller 2220 may be performed by using a wireless communication method.

For example, signal transmission between the main controller 2210 and the carriage controller 2220 is performed by means of first and second optical modem units 2212 and 2222 respectively connected to the main controller 2210 and the carriage controller 2220. To be specific, the first optical modem unit 2212 may be disposed at the upper part of the main frame 2102, and the second optical modem unit 2222 may be mounted in the carriage module 2110 so as to face the first optical modem unit 2212.

The first and second optical modem units 2212 and 2222 may transmit signals using invisible laser beams having different wavelengths. As an example, the first and second optical modem units 2212 and 2222 may be respectively connected to the main controller 2210 and the carriage controller 2220 through a wired or wireless network using a TCP/IP protocol.

The main controller 2210 may control the operation of the drive module 2140 to control the position of the carriage module 2110, and transmit a control signal for the operation of a carriage robot 2118 of the carriage module 2110 to the carriage controller 2220. For example, a distance sensor 2230 for detecting the position of the carriage module 2110 may be disposed at the upper part of the main frame 2102, and the main controller 2210 may control the operation of the drive module 2140 using a measured value provided by the distance sensor 2230. The distance sensor 2230 may measure the distance from the top of the main frame 2102 to the carriage module 2110, and as an example, a laser sensor may be used as the distance sensor 2230.

The tower lift 2100 may include guide rails 2104 extending parallel to each other in the vertical direction along the main frame 2102, guide units 2120 and 2130 mounted on the carriage module 2110 and guiding the carriage module 2110 in the vertical direction along the guide rails 2104, and a brake module 2150 attached to the carriage module 2110 and in close contact with the main frame 2102 to prevent the carriage module 2110 from falling in case a drive belt 2142 is broken.

For example, each side of the main frame 2102 may be provided with a pair of the guide rails 2104 extending parallel to each other in the vertical direction, and upper guide units 2120 and lower guide units 2130 coupled to the guide rails 2104 may be mounted in the carriage module 2110. The upper guide units 2120 and lower guide units 2130 may each include a side fixing roller 2128 disposed on the sides of the guide rails 2104. The side fixing roller 2128 may be used to prevent the carriage module 2110 from being separated from the guide rails 2104.

As an example, the drive module 2140 may be configured using a motor and a pulley, and one end of the drive belt 2142 may be connected to the carriage module 2110. In particular, a timing belt may be used as the drive belt 2142 to accurately control the position of the carriage module 2110, and a weight module 2144 for stable vertical transfer may be connected to the other end of the drive belt 2142. In addition, a balance belt 2146 may be connected to the carriage module 2110 and the weight module 2144, and an auto tensioner 2148 for applying a predetermined tensile force to the balance belt 2146 may be disposed at the lower part of the main frame 2102.

The carriage module 2110 may include a lift frame 2112 having a rear surface to which the upper and lower guide units 2120 and 2130 and the brake module 2150 are mounted, and a carriage robot 2118 mounted on the lift frame 2112 and for handling materials such as transfer objects, for example, semiconductor wafers or glass substrates. For example, the lift frame 2112 may include a lift plate 2114 having a rear surface and a support plate 2116 on which the carriage robot 2118 is installed, and the carriage robot 2118 may handle a storage container such as a front opening unified pod (FOUP) in which a plurality of substrates are stored. A holding unit 2119 for holding a storage container transported by the carriage robot 2118 may be provided on the lift frame 2112.

Meanwhile, the carriage controller 2220 may control the operation of the carriage robot 2118, and transmit an alarm signal generated in a situation such as an operation error of the carriage robot 2118, breakage of the drive belt 2142, etc. to the main controller 2210.

Figure 10:
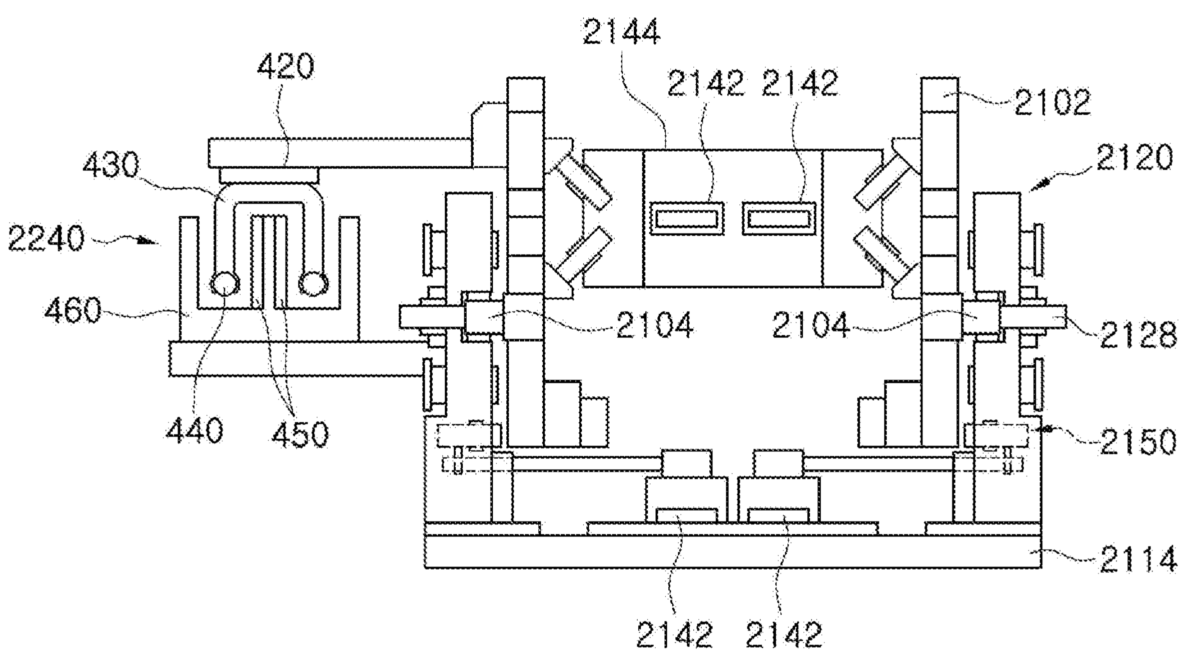
Figure 11:
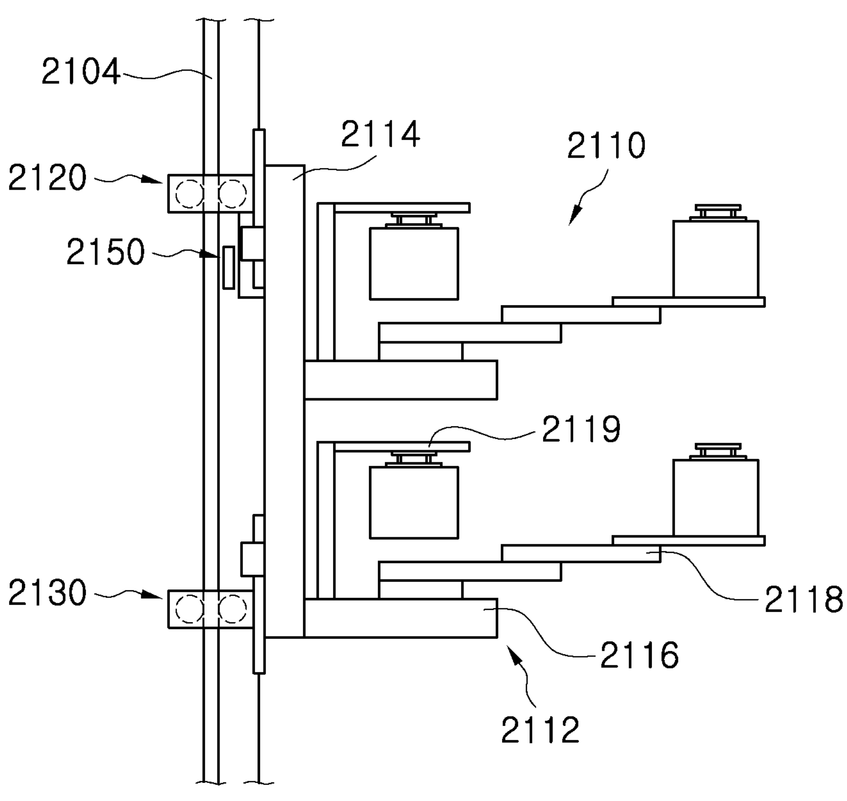

The power supply apparatus 400 according to the present disclosure may be provided as a part of the power supply part 2240 that supplies power to the carriage module 2110 in the tower lift 2100. Referring to FIG. 10, the first base member 410 is formed along the movement path of the carriage module 2110, and the second base member 420 made of a magnetic core material is provided on one side of the first base member 410. The track member 430 is installed on the second base member 420, and the power supply member 440 is provided at each end of the track member 430. As part of the pickup unit 2244 that receives power from carriage module 2110, the power reception core member 460 is provided on one side of the carriage module 2110 at a predetermined interval from the power supply member 440, and the power reception member 450 generating an induced current by the current of the power supply member 440 is installed on the power reception core member 460.

Figure 14:
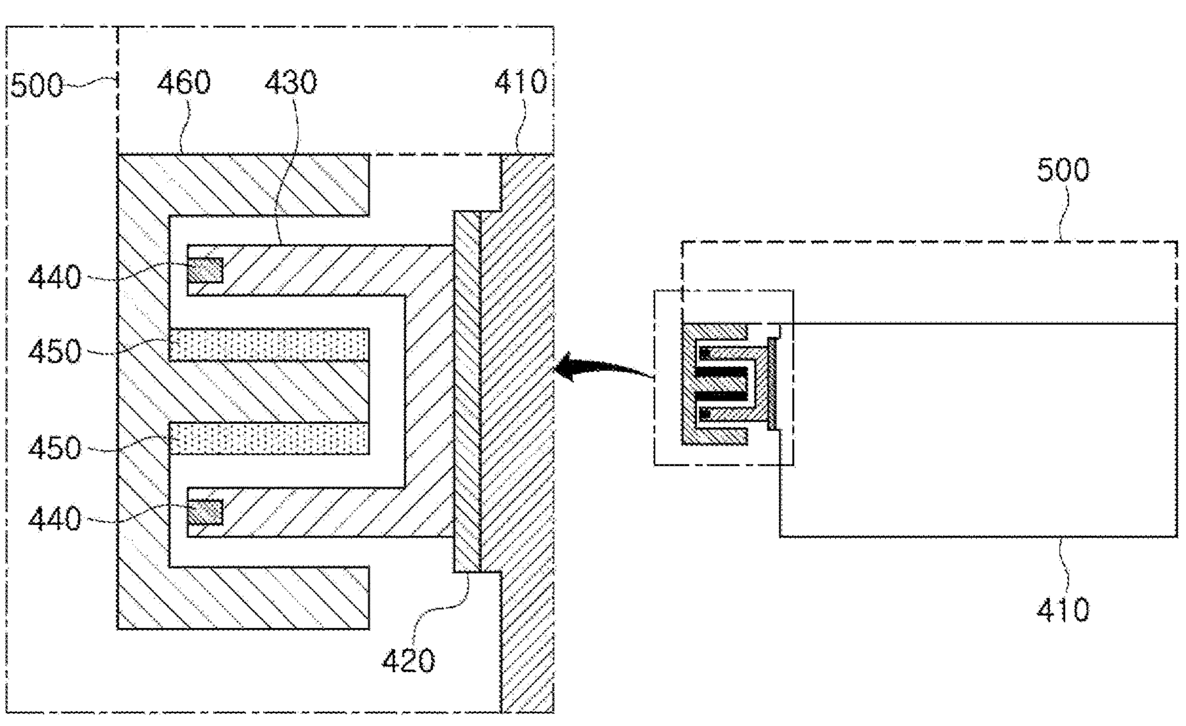
FIGS. 14 to 17 illustrate another example of the transport device to which the power supply apparatus according to the present disclosure is applied.
Figure 15:
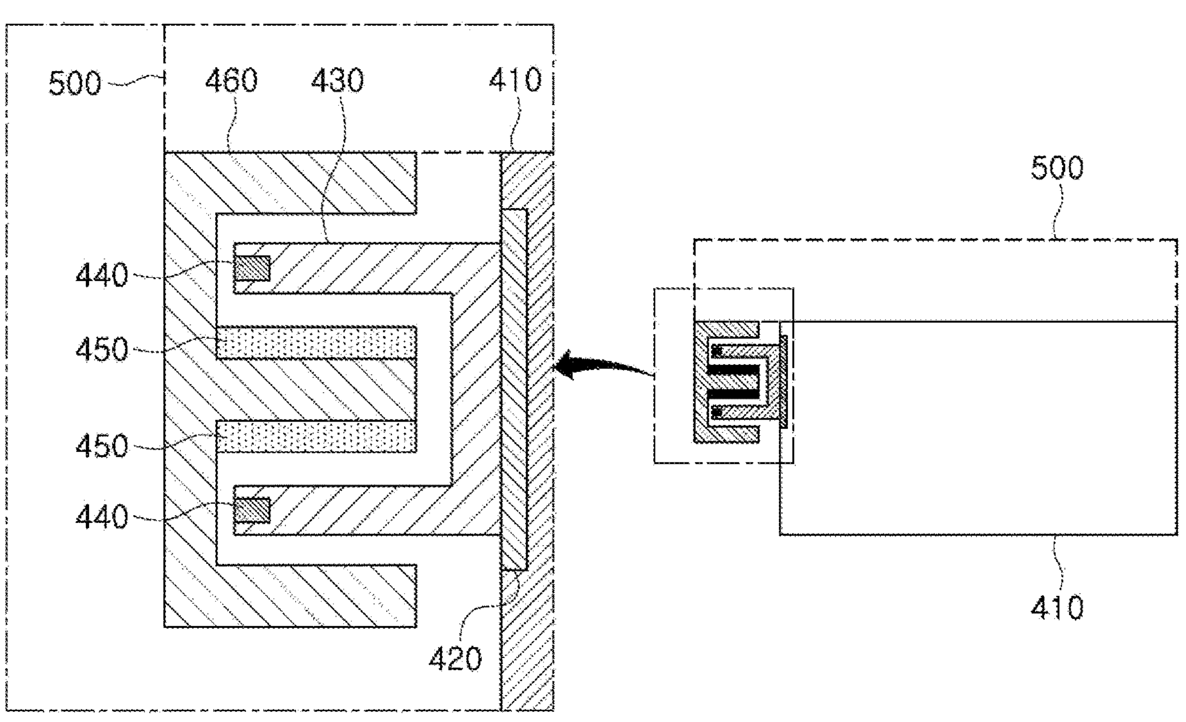
Figure 16:
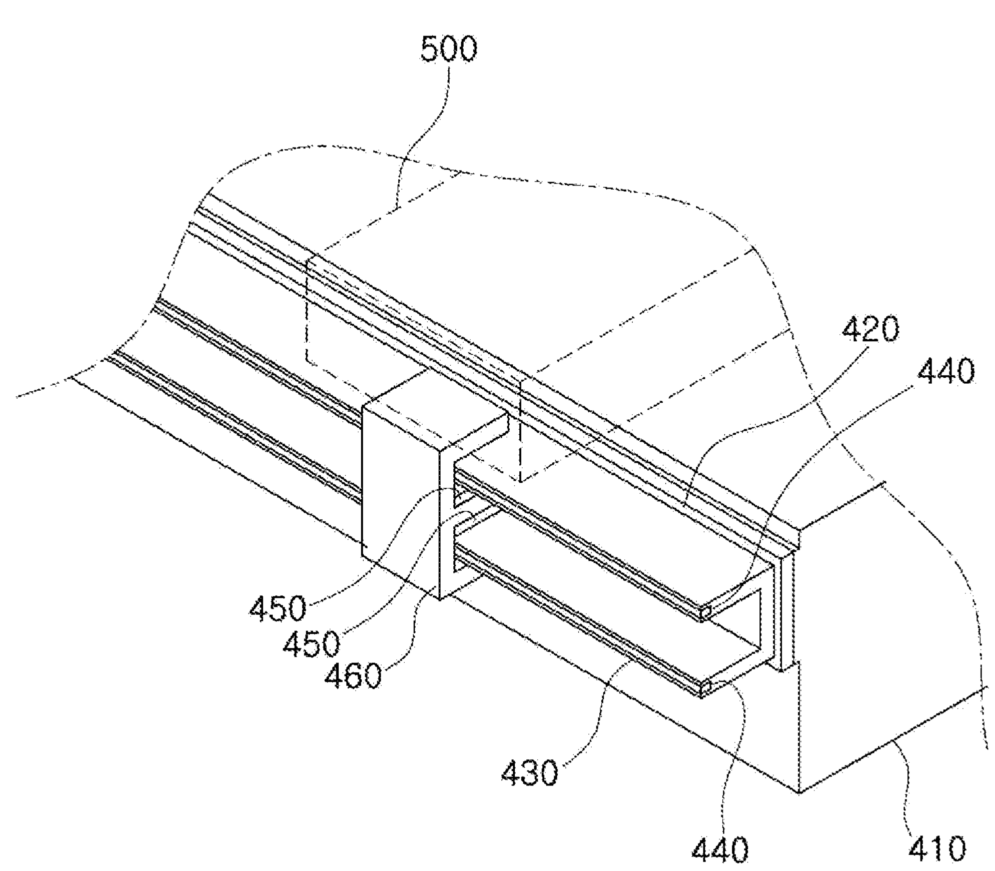
Figure 17:
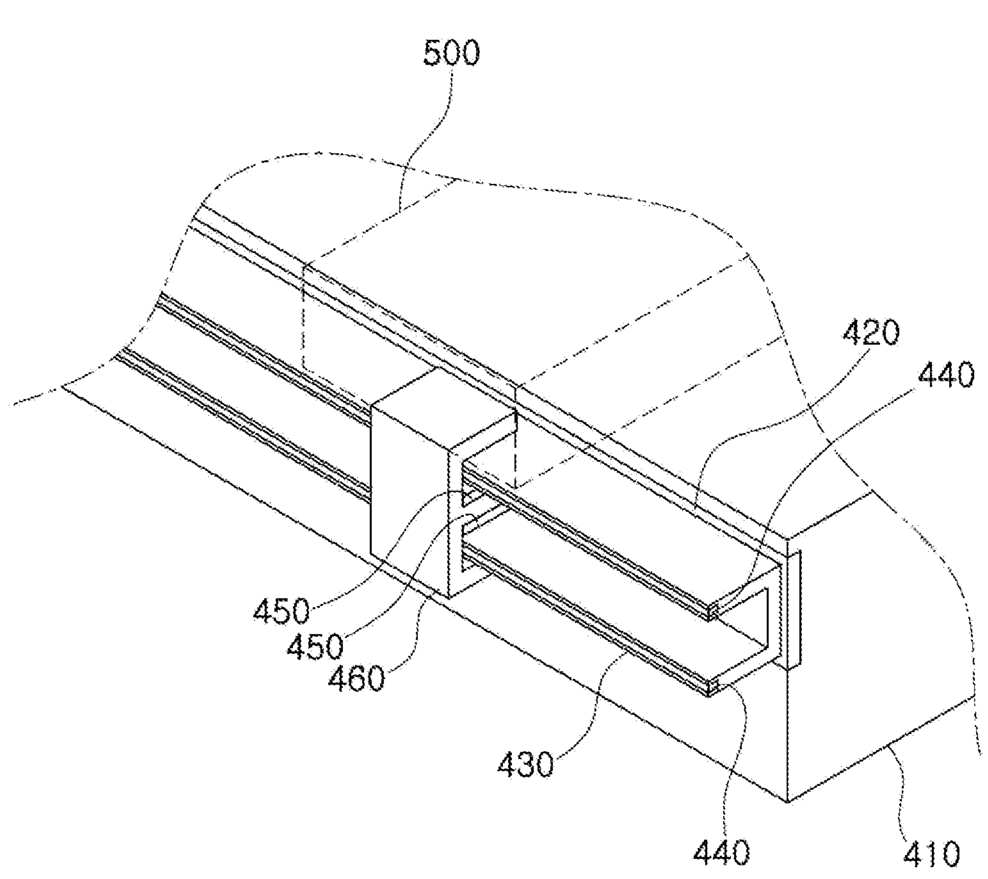

Meanwhile, although in FIGS. 2 to 4, a structure in which the power supply apparatus 400 is located under the transport device 500 has been described as an example, the power supply apparatus 400 may be configured on the side of the first base member 410 to supply power to the transport device 500. FIGS. 14 to 17 illustrate examples of the power supply apparatus 400 provided on the side of the first base member 410. FIGS. 14 and 16 illustrate a case where the second base member 420 is installed on the side of the first base member 410, while FIGS. 15 and 17 illustrate the case where the second base member 420 is inserted into a groove formed on the side surface of the first base member 410. The first base member 410 may correspond to an enclosure of the linear motor, and the transport device 500 may correspond to a moving body that moves linearly by the linear motor.

Referring to FIGS. 14 and 16, the second base member 420 made of a magnetic core material (e.g., ferrite core) is installed on the sidewall of the first base member 410, and the track member 430 is installed on the side of the second base member 420. The power reception member 450 in which an induced current is generated is configured in a partial region of the power reception core member 460.

Referring to FIGS. 15 and 17, the second base member 420 made of a magnetic core material (e.g., ferrite core) is inserted into a groove formed on the sidewall of the first base member 410, and the track member 430 is installed on the side of the second base member 420. The power supply member 440 is installed at each end of the track member 430 to which current for power supply is applied. The power reception core member 460 made of a magnetic core material (e.g., ferrite core) is positioned on one side of the transport device 500. The power reception member 450 in which an induced current is generated is configured in a partial region of the power reception core member 460.

The present embodiments and the drawings accompanying this specification only clearly show some of the technical ideas included in the present disclosure, and it will be apparent that all modifications and specific embodiments that may be easily inferred by those skilled in the art within the scope of the technical idea included in the specification and drawings of the present disclosure are included in the scope of the present disclosure.

Therefore, the spirit of the present disclosure should not be limited to the described embodiments, and it will be said that not only the claims to be described later but also all things that are equivalent to the claims or have equivalent modifications belong to the scope of the present disclosure.

What is claimed is:

1. A power supply apparatus that supplies power to a transport device in semiconductor manufacturing equipment, the apparatus comprising:
- a first base member made of a conductive material and installed along a moving path of the transport device;
- a second base member made of a magnetic core material and having a first surface contacting the first base member;
- a track member disposed on a second surface of the second base member, the second surface being opposite to the first surface;
- a power supply member installed in the track member and to which current is applied to supply power; and
- a power reception core member provided in the transport device,
- wherein the power reception core member includes a power reception member disposed at a predetermined interval from the power supply member, and magnetically coupled to the power supply member to generate an induced current.

2. The apparatus of claim 1,
wherein the second base member is provided on top of the first base member.

3. The apparatus of claim 1,
wherein the second base member is configured to be inserted into a groove formed in the first base member.

4. The apparatus of claim 1,
wherein the first base member is made of aluminum (Al) material.

5. The apparatus of claim 1,
wherein the second base member is composed of one of a ferrite core, powdered Permalloy, or mu-metal.

6. The apparatus of claim 1,
wherein the power reception core member is a ferrite core having an “E” shape and composed of a plurality of protrusions, and
the power supply member is located in a space between the plurality of protrusions of the power reception core member, and
the power reception member is provided on each side of a central protrusion among the plurality of protrusions of the power reception core member.

7. The apparatus of claim 1,
wherein the power reception core member is a ferrite core having a “T” shape in which a protrusion is formed in the center, and
the power supply member is located to be spaced apart from each side of the protrusion by a predetermined distance, and
the power reception member is provided on each side of the protrusion of the power reception core member.

8. A semiconductor manufacturing equipment, comprising:
- a processing module in which processes on substrates are performed;
- a substrate transfer robot configured to transfer the substrates; and
- a power supply apparatus configured to supply power to the substrate transfer robot,
- wherein the power supply apparatus comprises:
- a first base member made of a conductive material installed along a moving path of the substrate transfer robot;
- a second base member made of a magnetic core material and having a first surface contacting the first base member;
- a track member disposed on a second surface of the second base member, the second surface being opposite to the first surface;
- a power supply member installed on a side of the track member and to which current is applied to supply power; and
- a power reception core member provided in the substrate transfer robot,
- wherein the power reception core member includes a power reception member disposed at a predetermined interval from the power supply member, and magnetically coupled to the power supply member to generate an induced current.

9. The semiconductor manufacturing equipment of claim 8,
wherein the second base member is provided on an upper surface of the first base member.

10. The semiconductor manufacturing equipment of claim 8,
wherein the second base member is configured to be inserted into a groove formed in the first base member.

11. The semiconductor manufacturing equipment of claim 8,
wherein the first base member is made of aluminum (Al) material.

12. The semiconductor manufacturing equipment of claim 8, wherein the second base member is composed of one of a ferrite core, powdered Permalloy, or mu-metal.

13. The semiconductor manufacturing equipment of claim 8, wherein the power reception core member is a ferrite core having an "E" shape and composed of a plurality of protrusions, and the power supply member is located in a space between the plurality of protrusions of the power reception core member, and the power reception member is provided on each side of a central protrusion among the plurality of protrusions of the power reception core member.

14. The semiconductor manufacturing equipment of claim 8, wherein the power reception core member is a ferrite core having a "T" shape in which a protrusion is formed in the center, and the power supply member is each located to be spaced apart from each side of the protrusion by a predetermined distance, and the power reception member is provided on each side of the protrusion of the power reception core member.

15. A transport system for transporting articles in a semiconductor manufacturing plant, the system comprising:

a travel rail configured to provide a travel path of a transport cart for transporting the articles; and a power supply apparatus configured to supply power to the transport cart, wherein the power supply apparatus comprises:

a first base member made of a conductive material installed along a moving path of the transport cart;

a second base member made of a magnetic core material and having a first surface contacting a surface of the first base member;

a track member disposed on a second surface of the second base member, the second surface being opposite to the first surface;

a power supply member installed in the track member and to which current is applied to supply power; and a power reception core member provided in the transport cart, wherein the power reception core member includes a power reception member disposed at a predetermined interval from the power supply member, and magnetically coupled to the power supply member to generate an induced current.

16. The system of claim 15, wherein the second base member is provided on an upper surface of the first base member.

17. The system of claim 15, wherein the second base member is configured to be inserted into a groove formed in the first base member.

18. The system of claim 15, wherein the first base member is made of aluminum (Al) material, while the second base member is composed of one of a ferrite core, powdered Permalloy, or mu-metal.

19. The system of claim 15, wherein the power reception core member is a ferrite core having an "E" shape and composed of a plurality of protrusions, and the power supply member is located in a space between the plurality of protrusions of the power reception core member, and the power reception member is provided on each side of a central protrusion among the plurality of protrusions of the power reception core member.

20. The system of claim 15, wherein the power reception core member is a ferrite core having a "T" shape in which a protrusion is formed in the center, and the power supply member is each located to be spaced apart from each side of the protrusion by a predetermined distance, and the power reception member is provided on each side of the protrusion of the power reception core member.

* * * * *